(12) United States Patent
Aizawa et al.

(10) Patent No.: US 7,262,076 B2
(45) Date of Patent: Aug. 28, 2007

(54) METHOD FOR PRODUCTION OF SEMICONDUCTOR PACKAGE

(75) Inventors: Mitsuhiro Aizawa, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 33 days.

(21) Appl. No.: 11/113,267

(22) Filed: Apr. 25, 2005

(65) Prior Publication Data

US 2005/0277225 A1 Dec. 15, 2005

(30) Foreign Application Priority Data

Jun. 9, 2004 (JP) .............................. 2004-170946

(51) Int. Cl.
*H01L 21/00* (2006.01)

(52) U.S. Cl. ..................... 438/106; 439/83; 439/84; 29/830; 29/843; 29/844; 29/845

(58) Field of Classification Search ................ 29/845, 29/852
See application file for complete search history.

(56) References Cited

U.S. PATENT DOCUMENTS

| | | | |
|---|---|---|---|
| 4,346,516 A | | 8/1982 | Yokouchi et al. |
| 5,262,226 A | * | 11/1993 | Yoshida ................... 428/209 |
| 5,497,545 A | * | 3/1996 | Watanabe et al. ........... 29/830 |
| 6,242,079 B1 | * | 6/2001 | Mikado et al. ............. 428/209 |
| 6,440,835 B1 | | 8/2002 | Lin |
| 6,459,585 B1 | | 10/2002 | Bergstedt et al. |
| 6,653,217 B1 | * | 11/2003 | Lin .............................. 438/612 |
| 6,938,336 B2 | * | 9/2005 | Ito et al. ....................... 29/852 |
| 2002/0189861 A1 | | 12/2002 | Hall et al. |
| 2003/0019917 A1 | * | 1/2003 | Furuno et al. ............... 228/246 |
| 2004/0025332 A1 | | 2/2004 | Haberer et al. |

FOREIGN PATENT DOCUMENTS

| | | |
|---|---|---|
| EP | 0 561 620 A2 | 3/1993 |
| GB | 2163007 A | 2/1986 |
| JP | 1-258457 | 10/1989 |
| JP | 2000-286304 | 10/2000 |
| JP | 2001-308122 | 11/2001 |

OTHER PUBLICATIONS

European Search Report, dated Sep. 13, 2005, for related European Patent Application No. EP 05 00 7800.

* cited by examiner

*Primary Examiner*—Matthew Smith
*Assistant Examiner*—Ankush Singal
(74) *Attorney, Agent, or Firm*—Staas & Halsey LLP

(57) ABSTRACT

A method for production of a semiconductor package which enables uniform conduction processing for all through holes covered by the conduction processing without being limited to any specific structure, is free from surface relief shapes and internal voids, and enables conduction processing simply, in a short time, at a low cost utilizing existing facilities, wherein the conduction processing of the through holes includes a step of press fitting a conductor into the through holes by a ball bonder and a step of flattening the exposed heads of the press-fit conductors by coining.

6 Claims, 4 Drawing Sheets

(1)

(2)

(3)

(4)

METHOD FOR PRODUCTION OF SEMICONDUCTOR PACKAGE

BACKGROUND OF THE INVENTION

1. Field of the Invention

The present invention relates to a method for production of a semiconductor package including conduction processing of through holes in an electronic circuit board.

2. Description of the Related Art

Today, a large variety of semiconductor packages are being used. Even looking at just the electronic circuit boards constituting their basic structures, there are Si and other semiconductor wafers and chips formed with semiconductor circuits and also Si interposers, glass boards, ceramic boards, plastic boards (printed circuit boards, films, etc.) and a large number of other types of boards being used.

To produce a semiconductor package, processing is frequently performed for providing conduction of through holes passing through such electronic circuit boards. The quality and efficiency of the same have extremely important significance in terms of the performance and durability of the semiconductor package and cost.

In the past, through hole connection processing was performed by electroplating the through hole or filling same with a conductive paste. For example, Japanese Unexamined Patent Publication (Kokai) No. 1-258457 describes through hole conduction processing using electroplating. However, conduction processing using electroplating suffers from the problems of an uneven state of plating depending upon the position of the through holes, relief shapes at the plated surfaces at the ends of the through holes, susceptibility to residual voids inside the through holes and other such problems in quality and also long plating times, troublesome maintenance and management due to plating by wet processing, complicated processing steps requiring masking, mask peeling, etc. and other problems in efficiency. Filling conductive paste has similar problems.

As another method for providing conduction between the two sides of a board through a through hole, Japanese Unexamined Patent Publication (Kokai) No. 2001-3081 22 describes method of inserting a capillary of wire bonding tool into the through hole of the board, wire bonding to an underlying electrode, and leading out a gold wire through the through hole for conduction.

However, this method requires an underlying electrode forming the bottom surface of the through hole, and so is limited to the specific cases of using such a structure. Consequently, it cannot be applied to general through holes open at the two ends. Further, this is predicated on it being possible to insert the capillary of a wire bonding tool into the through hole, so the thickness of the tip of the capillary is limited or the through hole is limited to a large diameter case, so this is not suitable for reducing the size of the semiconductor package—which would require finer through holes.

Further, Japanese Unexamined Patent Publication (Kokai) No. 2000-286304 describes a method of production of a semiconductor package comprising positioning a semiconductor chip with a circuit board having a projection at the position of the through hole of its electrode and connecting them by inserting the projecting electrode into the through hole for conduction processing of the through hole.

This method, however, is a method for flip-chip mounting and requires a circuit board having a projection at the position of the through hole of the electrode of the semiconductor chip and stacks the semiconductor chip and circuit board all together, so does not allow individual conduction processing for through holes at any locations.

SUMMARY OF THE INVENTION

An object of the present invention is to provide a method of producing a semiconductor package which eliminates the above problems of the related art, enables uniform conduction processing for all through holes covered by the conduction processing without being limited to any specific structure, is free from surface relief shapes and internal voids, and enables conduction processing simply, in a short time, at a low cost utilizing existing facilities.

To attain the above object, according to the present invention, there is provided a method for production of a semiconductor package including conduction processing of a through hole of an electronic circuit board wherein the conduction processing of the through hole includes a step of press-fitting a conductor into the through hole by a ball bonder and a step of flattening the exposed head of the press-fit conductor by coining.

Since an existing ball bonder is used to press-fit a conductor in a through hole by basically the same operation as ordinary wire bonding, then the exposed head of the press-fit conductor is flattened by coining, there is no limit on structure, any necessary through holes can be made uniform individually and as a whole, no surface relief shapes or internal voids are caused, and quick conduction processing becomes possible. Note that the "ball bonder" is basically the same in structure as a general wire bonder for connecting a semiconductor chip and package by wires.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

As the simplest basic mode of the invention, a ball bonder is used to press-fit a conductor from either end of a through hole a single time. This mode is possible when the ratio of the through hole height/through hole diameter (aspect ratio) is small.

When it is not possible to sufficiently fill a through hole all the way to the other end by press-fitting from one end, conductors are press-fit from both ends of the through hole at least one time each so as to fill the entire length of the through hole with the conductor. This mode requires that the aspect ratio of the through hole be larger.

As another mode, by forming the through hole with a taper and press-fitting a conductor from the large diameter end, it is possible to fill the entire length of a through hole with a conductor even if the aspect ratio of the through hole becomes relatively large or by a smaller number of press-fittings if the same aspect ratio.

Further, as another preferable mode, a conductor is press-fit from only one end of a through hole a plurality of times so as to fill the entire length of the through hole with a conductor. Efficient conduction processing becomes possible without the need for resetting a board upside down.

As a mode used along with conventional conduction processing using plating, it is possible to press-fit a conductor from one end of a through hole to fill the through hole with a conductor from that end of the through hole to the middle, then perform plating from the other end of the through hole so as to fill the entire length of the through hole with a conductor. In this case as well, it is possible to greatly reduce the time, compared with when filling the entire length of a through hole by plating, and the occurrence of internal voids can also be reduced. It is possible to apply the present invention to the one side of the through hole particularly requiring flatness of the head and apply plating to the opposite side not requiring flatness too much.

EXAMPLES

Example 1

An example according to the basic mode of the present invention will be explained first using FIG. 1.

Figure 1:
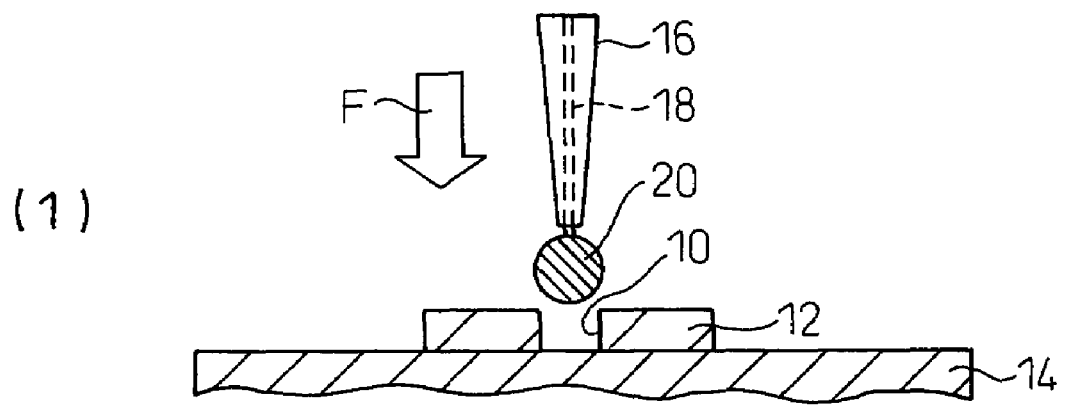
FIG. 1 gives cross-sectional views of an example of the steps of conduction processing of the simplest mode of the present invention, that is, filling an entire length of a through hole with a conductor by a single press-fitting operation from one end of the through hole.
Figure 1:
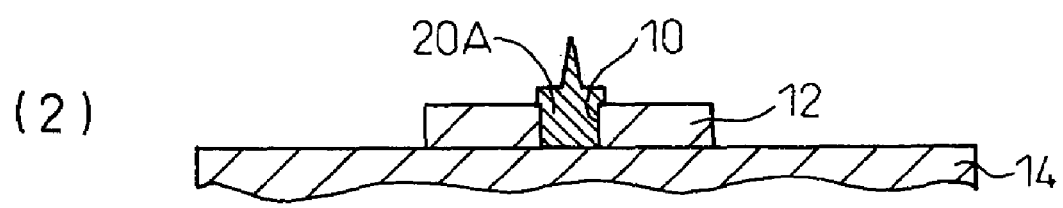
Figure 1:
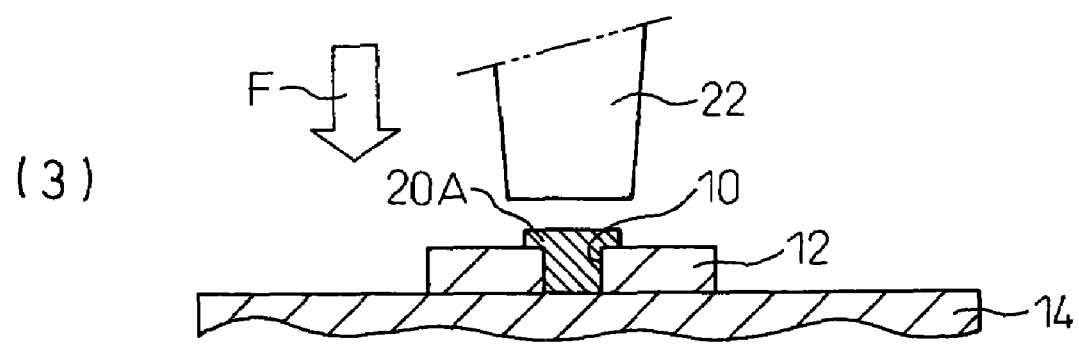
Figure 1:
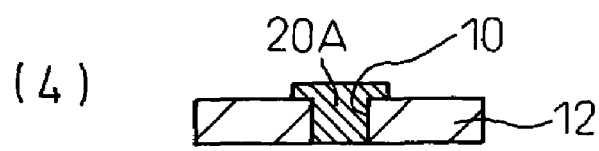

As shown in FIG. 1(1), a board 12 having a through hole 10 is placed on a jig 14, then a gold or other conductor wire 18, supplied from a capillary 16 of a ball bonder, is lowered as shown by the arrow F in the state with a conductor ball 20 formed at its tip.

FIG. 1(2) shows the state after press-fitting the conductor ball 20 in the through hole 10 of the board 12 by the tip of the capillary 16, then raising the capillary 16 and cutting the conductor wire 18 at its tip. These press-fitting and cutting operations are performed by heating and holding the board 12 and applying an ultrasonic wave. The operation of the capillary 16 is the same as an ordinary wire bonding operation. The exposed head of the conductor 20A filled in the through hole 10 is formed with a projection as illustrated by the cross-section of the conductor wire 18. In this example, the entire length of the through hole 10 is filled with the conductor 20A by a single press-fitting.

Next, as shown in FIG. 1(3), a coining tool 22 is used to flatten the exposed head of the filled conductor 20A by coining. The capillary 16 may also be used dually as a coining tool 22.

Finally, the board 12 is detached, whereupon a state with the entire length of the through hole 10 filled with a conductor 20 is obtained.

This example uses a single press-fitting to fill the entire length of the through hole with a conductor. As a typical example, in the case of a through hole diameter of 60 μm and a depth of 50 μm and with a board temperature of 150° C., an ultrasonic wave output of 62.5 kHz, and an amplitude of 5 μm, the desirable ranges of conditions are as follows:

Ultrasonic wave application time: 10 to 50 ms
Press-fitting force: 20 to 250 g
Wire material: Au, Cu
Wire diameter: 15 to 50 μm
Tip ball diameter: 20 to 150 μm Note that if performing the press-fitting operation a plurality of times under the above conditions, it is possible to perform conduction processing for a through hole of a diameter of 50 to 70 μm and a depth of 30 to 300 μm.

As a typical example of a single press-fitting operation, when using gold (Au) wire as the conductor wire for conduction processing of a through hole of an Si board, good filling was possible under the following conditions:

Through hole diameter: 60 μm
Through hole depth: 50 μm (=board thickness)
Board temperature: 150° C.
Ultrasonic wave application time: 30 ms
Ultrasonic wave output: Frequency 62.5 kHz, amplitude 5 μm
Press-fitting force: 40 g
Gold wire diameter: 25 μm
Gold ball diameter: 80 μm

Example 2

An example of the mode of press-fitting from the two ends of a through hole will be explained next using FIG. 2.

Figure 2:
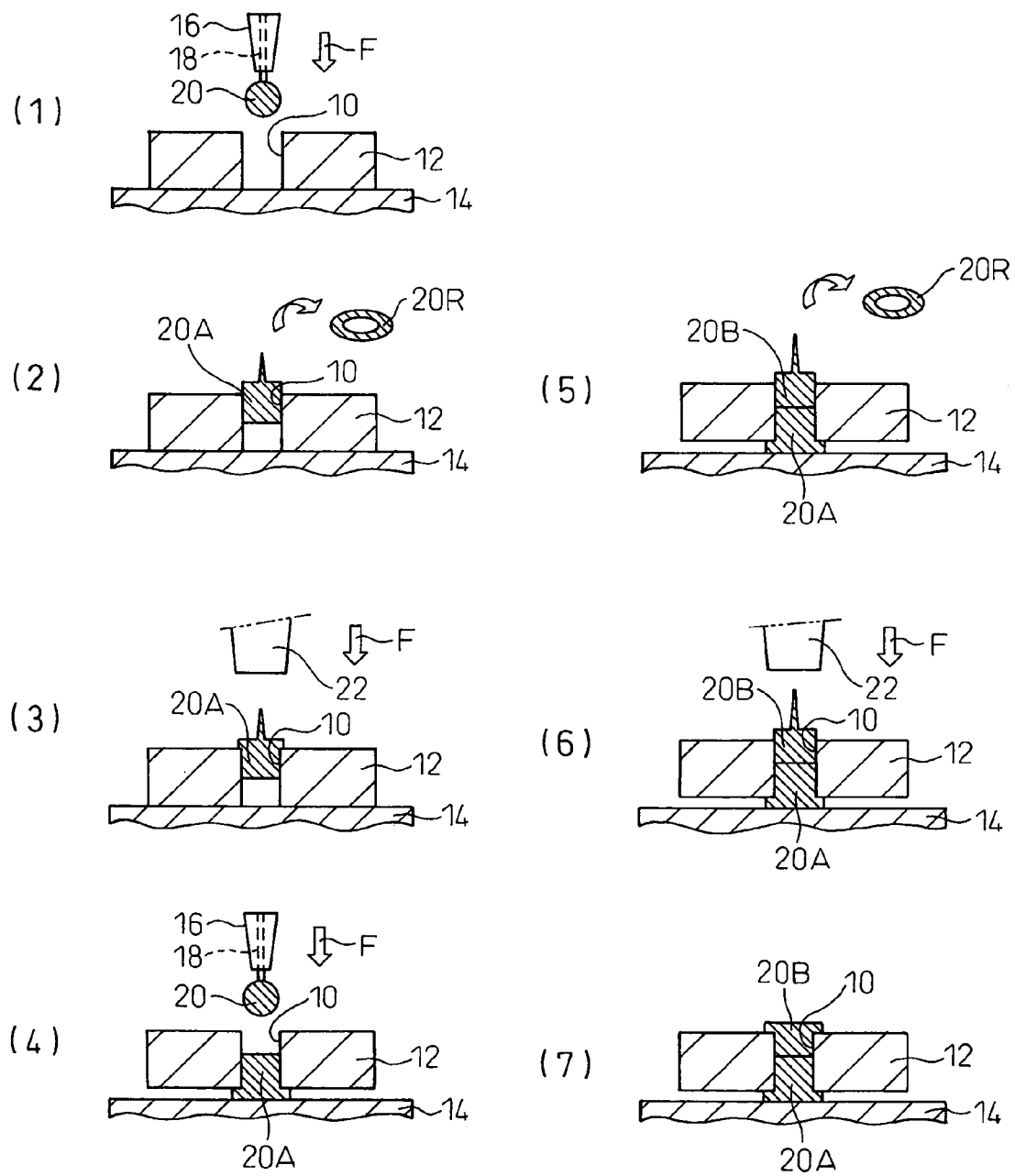
FIG. 2 gives cross-sectional views of an example of the steps of conduction processing press-fitting a conductor from the two ends of the through hole according to the present invention.

As shown in FIG. 2(1), a board 12 having a through hole 10 is placed on a jig 14, then a gold or other conductor wire 18 supplied from a capillary 16 of a ball bonder is lowered as shown by the arrow F in the state with a conductor ball 20 formed at its tip.

As shown in FIG. 2(2), the tip of the capillary 16 press-fits the conductor ball 20 in the through hole 10 of the board 12, then the capillary 16 is raised and the conductor wire 18 is cut at its tip. These press-fitting and cutting operations are performed by heating and holding the board 12 and applying an ultrasonic wave. The operation of the capillary 16 is the same as an ordinary wire bonding operation. The exposed head of the conductor 20A filled in the through hole 10 is formed with a projection as illustrated by the cross-section of the conductor wire 18. In this example, down to half of the total length of the through hole 10 from its top end is filled with the conductor 20A by a single press-fitting. The region deeper than that is left as an unfilled space.

Note that 20R is a burr around the exposed head of the filled conductor 20A. The state of removing this by an air blower is shown. FIG. 1 of Example 1 does not show the burr, but this was simply omitted. It occurs and is removed in the same way as in this example.

Next, as shown in FIG. 2(3), a coining tool 22 is used to flatten the exposed head of the filled conductor 20A by coining. The capillary 16 may also be used dually as a coining tool 22.

Next, as shown in FIG. 2(4), the board 12 is turned upside down and placed on the jig 14, then the same operation as in FIG. 2(1) is used to press-fit a conductor ball 20 from the opposite end of the through hole 10.

Due to this, as shown in FIG. 2(5), the remaining part of the through hole 10 is filled with the conductor 20A and a state where the entire length of the through hole 10 is filled with the conductors 20A and 20B is obtained.

Next, as shown in FIG. 2(6), the same operation as in FIG. 2(3) is used to flatten the exposed head of the filled conductor 20B by coining.

Due to this, as shown in FIG. 2(7), a state where the conductor 20A and the conductor 20B are integrally joined and thereby the entire length of the through hole is filled with a conductor is obtained. According to this example, good conduction processing can be performed for a through hole of the same diameter, 60 μm, as Example 1, provided in a Si board of a thickness of 100 μm or twice that of Example 1.

The obtained integral filled conductor 20A+20BA becomes a rivet structure as illustrated, whereby a particularly high reliability is obtained even against mechanical load.

Example 3

Figure 3:
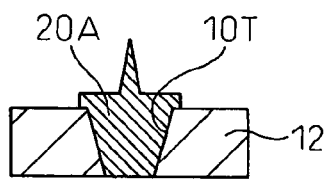
FIG. 3 is a cross-sectional view of an example of use of a tapered through hole according to the present invention.

An example of the embodiment providing a through hole with a taper will be explained next with reference to FIG. 3.

As illustrated, if press-fitting the conductor from the large diameter side (top side in the figure) of a tapered through hole 10T, it is possible to fill a through hole 10T of a depth of 100 μm, the same as in Example 2, over its entire length by a conductor 20A. According to this mode, the conductor 20A becomes resistant to detachment from the large diameter side to the small diameter side (downward direction in the figure) and thereby the reliability becomes that much higher.

Example 4

An example of the mode of press-fitting a conductor a plurality of times from one end of a through hole will be explained with reference to FIG. 4.

Figure 4:
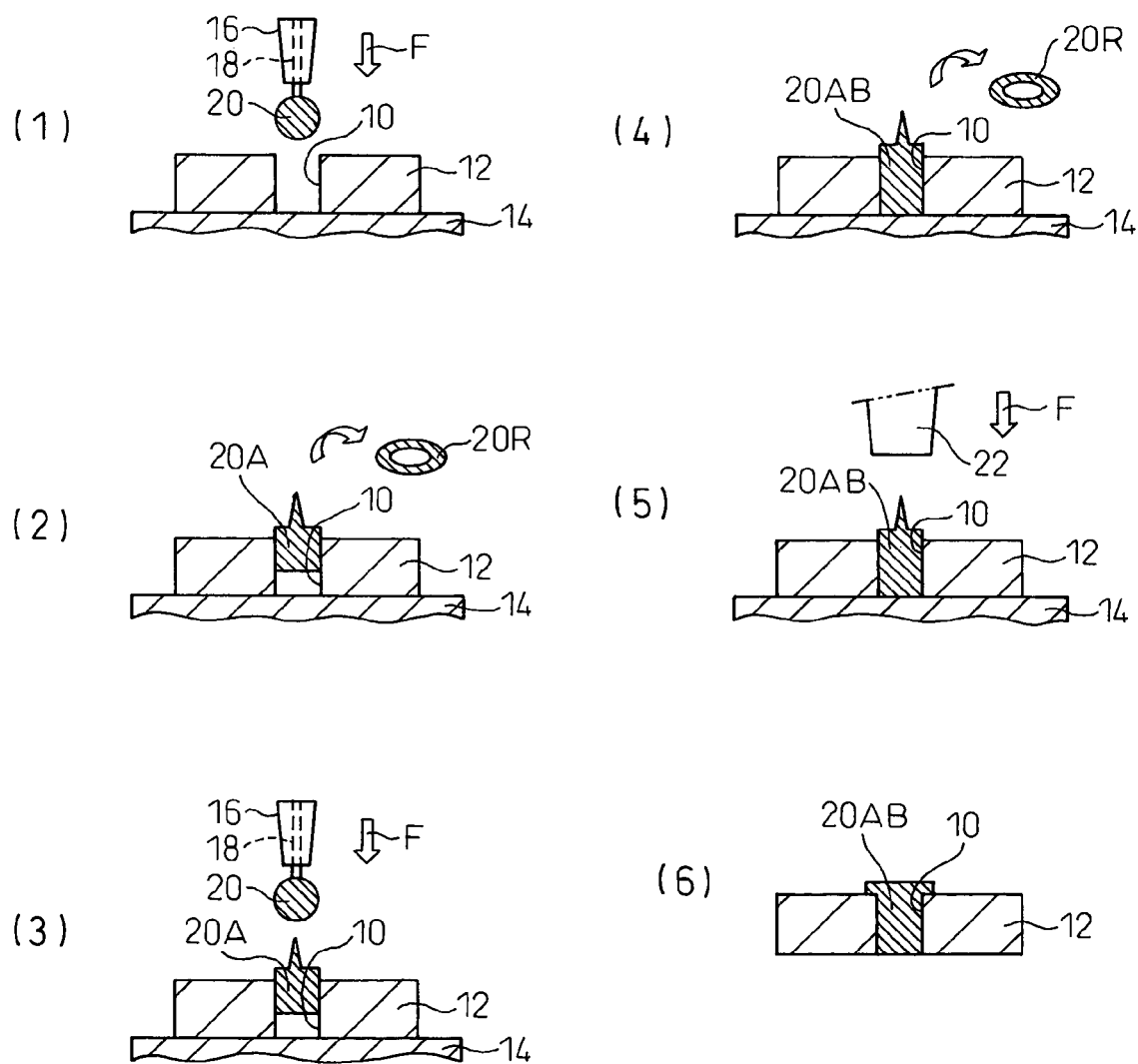
FIG. 4 presents cross-sectional views of an example of the steps of conduction processing press-fitting a conductor from one end of a through hole a plurality of times according to the present invention.

As shown in FIG. 4(1) to FIG. 4(2), the same operation as in FIG. 2(1) to FIG. 2(2) of Example 2 is used to fill the through hole 10 with a conductor 20A down to half of its entire length. The burr 20R is similarly removed.

Next, as shown in FIG. 4(3), the same operation as in FIG. 4(1) is used to further press-fit a conductor ball 20 from above the filled conductor 20A.

FIG. 4(4) shows the state where the second press-fitting caused the entire length of the through hole 10 to be filled with the conductor 20AB.

Next, as shown in FIG. 4(5), a coining tool 22 is used to flatten the exposed head of the filled conductor 20AB by coining.

Finally, as shown in FIG. 4(6), if the board 12 is detached from the jig 14, a state where the entire length of the through hole 10 is filled with the conductor 20AB is obtained.

As a specific example of multiple press-fitting from one end of a through hole, it was possible to perform good conduction processing of a through hole of a relatively thick Si board of a thickness of 100 μm using gold (Au) wire as the conductor wire by three press-fitting operations under the following conditions:

Through hole diameter: 60 μm
Through hole depth: 100 μm
Ultrasonic wave application time: 30 ms
Ultrasonic wave output: Frequency 62.5 kHz, amplitude 5 μm
Press-fitting force: 40 g
Gold wire diameter: 25 μm
Gold ball diameter: 80 μm Example 5

An example of the mode of press-fitting from one end and filling the remaining space by plating will be explained next using FIG. 5.

Figure 5:
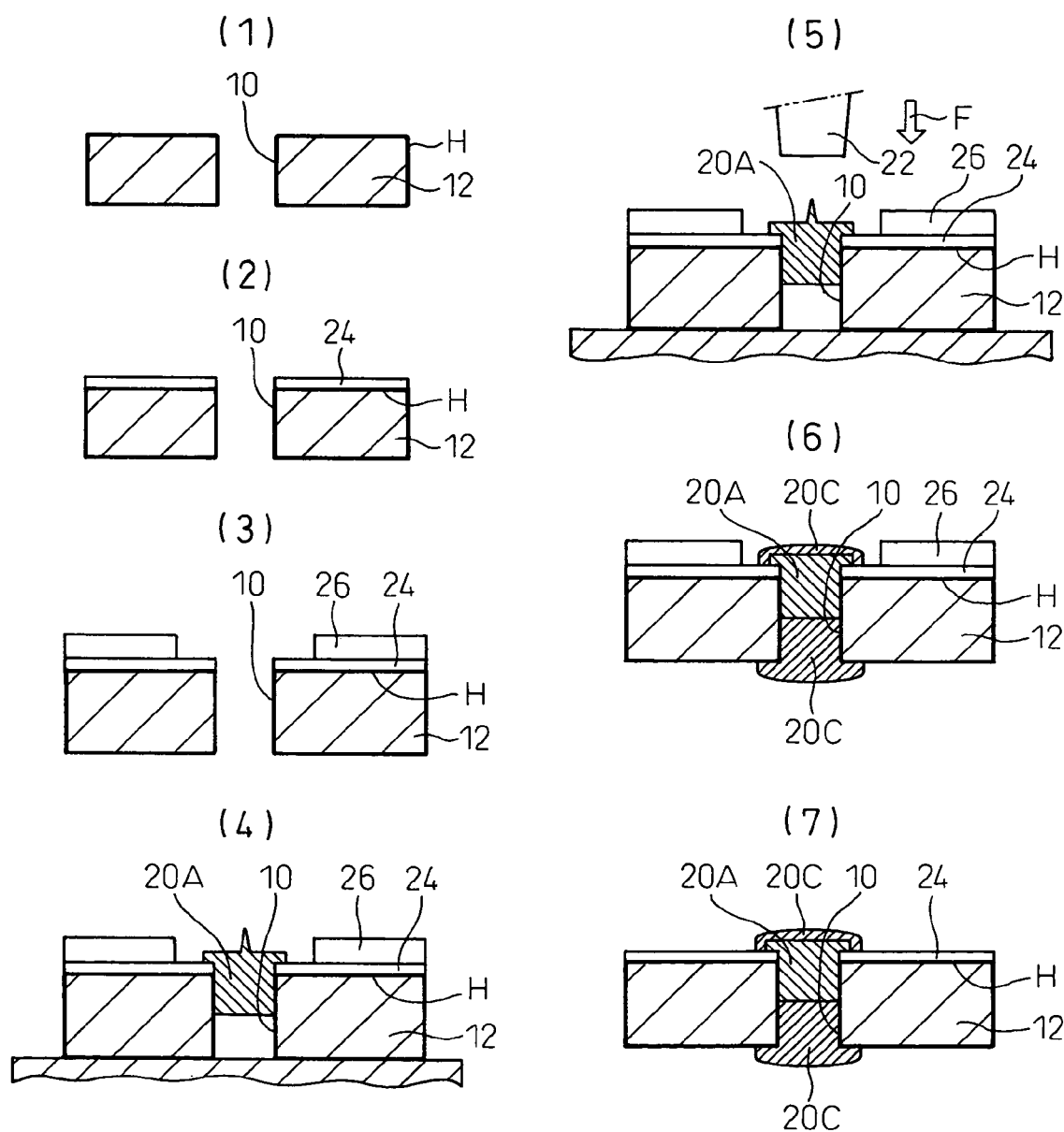
FIG. 5 gives cross-sectional views of an example of the steps of conduction processing filling a conductor by press-fitting from one end of a through hole and filling a conductor by plating from the other end according to the present invention.

As shown in FIG. 5(1), a Si board 12 having a through hole 10 is heat treated at 800 to 1100° C. to form a heat oxide film H.

Next, as shown in FIG. 5(2), the heat oxide film H at the top surface of the board 12 is formed with a seed layer 24 by sputtering. The seed layer is for example formed by Cr/Cu sputtering or Ti/Cu (Ti/Al, Ti/Au) sputtering by 0.5 Pa and DC 100V.

Next, as shown in FIG. 5(3), a plating resistant mask 26 is formed on the seed layer 24 by adhering DFR (dry film resists) and photolithography.

Next, as shown in FIG. 5(4), a ball bonder is used to press-fit gold 20A and fill the through hole 10 down to half of its total length from the top end.

Next, as shown in FIG. 5(5), a coining tool 22 is used for coining to flatten the exposed head of the filled gold 20A.

Next, as shown in FIG. 5(6), electroplating is used to fill the remaining part of the through hole 10 by filled gold 20C.

Finally, as shown in FIG. 5(7), the DFR mask 26 is peeled off. Due to this, the through hole 10 is filled over its entire length by the gold 20A filled by press-fitting from one end and the gold 20C filled by plating from the other end.

According to the present embodiment, it is possible to shorten the conduction processing time compared with the case of filling the entire length of a through hole by plating.

Summarizing the effects of the invention, there is provided a method for production of a semiconductor package which eliminates the above problems of the related art, enables uniform conduction processing for all through holes covered by the conduction processing without being limited to any specific structure, is free from surface relief shapes and internal voids, and enables conduction processing simply, in a short time, at a low cost utilizing existing facilities.

While the invention has been described with reference to specific embodiments chosen for purpose of illustration, it should be apparent that numerous modifications could be made thereto by those skilled in the art without departing from the basic concept and scope of the invention.

What is claimed is:

1. A method of producing a semiconductor package including conduction processing of a through hole of an electronic circuit board, comprising:
   press fitting a conductor into the through hole , from a first end of the through hole to fill the through hole with the conductor from said first end to the middle of the through hole;
   plating the through hole from a second, opposite end to the middle with conductor so as to complete filling the length of the through hole with conductor; and
   flattening the exposed head of the press-fit conductor by coining.

2. A method for production of a semiconductor package as set forth in claim 1, further comprising performing said press-fitting by a ball bonder.

3. A method of producing a semiconductor package as set forth in claim 1, further comprising:
   forming said through hole with a taper; and
   performing said press-fitting from a large diameter end of said through hole.

4. A method of producing a semiconductor package as set forth in claim 1, wherein said flattening comprises coining the exposed head of said press-fit conductor by a capillary of a ball bonder.

5. A method of producing a semiconductor package as set forth in claim 3, wherein said flattening comprises coining the exposed head of said press-fit conductor by a capillary of a ball bonder.

6. A method of producing a semiconductor package as set forth in claim 1, wherein said flattening comprises coining the exposed head of said press-fit conductor by a capillary of a ball bonder.

* * * * *

UNITED STATES PATENT AND TRADEMARK OFFICE
CERTIFICATE OF CORRECTION

PATENT NO.        : 7,262,076 B2
APPLICATION NO.   : 11/113267
DATED             : August 28, 2007
INVENTOR(S)       : Mitsuhiro Aizawa et al.

It is certified that error appears in the above-identified patent and that said Letters Patent is hereby corrected as shown below:

Column 1, Line 41, change "2001-3081 22" to --2001-308122--.

Column 1, Line 42, after "describes" insert --a--.

Column 1, Line 42, before "wire" insert --a--.

Signed and Sealed this

Twenty-second Day of July, 2008

JON W. DUDAS
*Director of the United States Patent and Trademark Office*